United States Patent [19]

Bickley et al.

[11] 4,388,597
[45] Jun. 14, 1983

[54] FREQUENCY SYNTHESIZER HAVING PLURAL PHASE LOCKED LOOPS

[75] Inventors: Robert H. Bickley, Scottsdale; Albert H. Hunt, Tempe, both of Ariz.

[73] Assignee: Motorola Inc., Schaumburg, Ill.

[21] Appl. No.: 388,392

[22] Filed: Jun. 14, 1982

Related U.S. Application Data

[63] Continuation of Ser. No. 156,221, Jun. 3, 1980, abandoned.

[51] Int. Cl.$^3$ .......................... H03L 7/18; H03L 7/22
[52] U.S. Cl. ........................................... 331/2; 331/4; 331/16; 331/25; 332/19
[58] Field of Search ..................... 331/2, 4, 16, 17, 18, 331/22, 25; 332/19; 455/260

[56] References Cited

U.S. PATENT DOCUMENTS

| | | | |
|---|---|---|---|
| 3,268,831 | 8/1966 | Noordanus et al. | 331/2 |
| 3,480,883 | 11/1969 | Gaunt, Jr. | 331/2 X |
| 4,149,125 | 4/1979 | Ikeguchi et al. | 331/25 X |
| 4,191,930 | 3/1980 | Harzer | 331/2 X |
| 4,225,830 | 9/1980 | Remy | 331/2 |

Primary Examiner—Siegfried H. Grimm
Attorney, Agent, or Firm—Eugene A. Parsons

[57] ABSTRACT

A first phase locked loop (PLL) having a second PLL with programmable divider therein supplying 50 kilohertz steps of coarse tuning to a mixer and a third PLL with programmable divider therein providing 50 Hertz fine tuning steps to a phase detector for providing any of a plurality of steps of frequency within a band of frequencies in response to control signals applied to the two programmable dividers.

10 Claims, 3 Drawing Figures

FREQUENCY SYNTHESIZER HAVING PLURAL PHASE LOCKED LOOPS

This is a continuation of application Ser. No. 156,221, filed on June 3, 1980 and now abandoned.

BACKGROUND OF THE INVENTION

Frequency synthesizers are utilized in a variety of electronic circuits, including test equipment and the like, wherein it is necessary to provide any of a wide range of frequencies. Generally the frequencies are provided in small steps over the entire range and may be provided by sweeping through the range a step at a time or moving directly to a desired step frequency.

Prior art frequency synthesizers are described in U.S. Pat. Nos. 3,696,906, entitled "Coherent Jump Frequency Synthesizer", issued Oct. 3, 1972, and 4,001,714, entitled "Search and Confirm Frequency Synthesizer", issued Jan. 4, 1977, both of which are assigned to the same assignee. Both of the above disclosed frequency synthesizers are less versatile and require much more complicated circuitry than the present frequency synthesizer.

SUMMARY OF THE INVENTION

The present invention pertains to an improved frequency synthesizer including a first phase locked loop having mixing means and phase detecting means connected therein. A second phase locked loop having a programmable divider connected therein supplies a reference frequency in predetermined steps to the mixing means and a third phase locked loop provides a reference frequency in predetermined steps, different than the predetermined steps from the second phase locked loop, to the phase detector. In the preferred embodiment a fourth phase locked loop provides a reference signal to mixing means in the third phase locked loop to reduce the operating frequency therein and the output of the fourth phase locked loop is mixed with an output from the first phase locked loop to extend the range of the synthesizer.

It is an object of the present invention to provide a new and improved frequency synthesizer.

It is a further object of the present invention to provide a new and improved frequency synthesizer utilizing a plurality of phase lock loops including programmable filters for producing a plurality of different sized steps of frequency in the synthesizer.

It is a further object of the present invention to provide a frequency synthesizer which is extremely versatile and includes structure to simplify and reduce the number of components.

It is a further object to provide a frequency synthesizer that can be frequency modulated and swept over a wide range of frequency in a linear sweep voltage versus frequency relationship.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
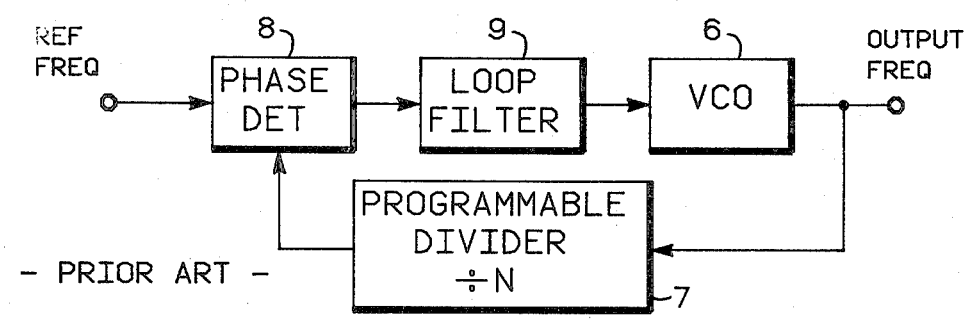
FIG. 1 is a simplified block diagram of a prior art phase locked loop frequency synthesizer.

Referring to FIG. 1, a simplified block diagram of a prior art frequency synthesizer is illustrated. This synthesizer includes a voltage controlled oscillator 6, a programmable divider 7, a phase detector 8 and a loop filter 9. The output of the oscillator 6, which is the output of the synthesizer, is fedback through the divider 7 to an input of the detector 8. The detector 8 compares the divided frequency to a reference frequency and supplies an error voltage through the filter 9 to control the oscillator 6. This circuit is well known and is used in applications where only a few selectable steps or frequencies are required. The circuit can produce multiple frequencies with digital programming but large numbers of steps or a wide range of frequencies requiring many VCO's can become expensive and complicated.

Figure 2:
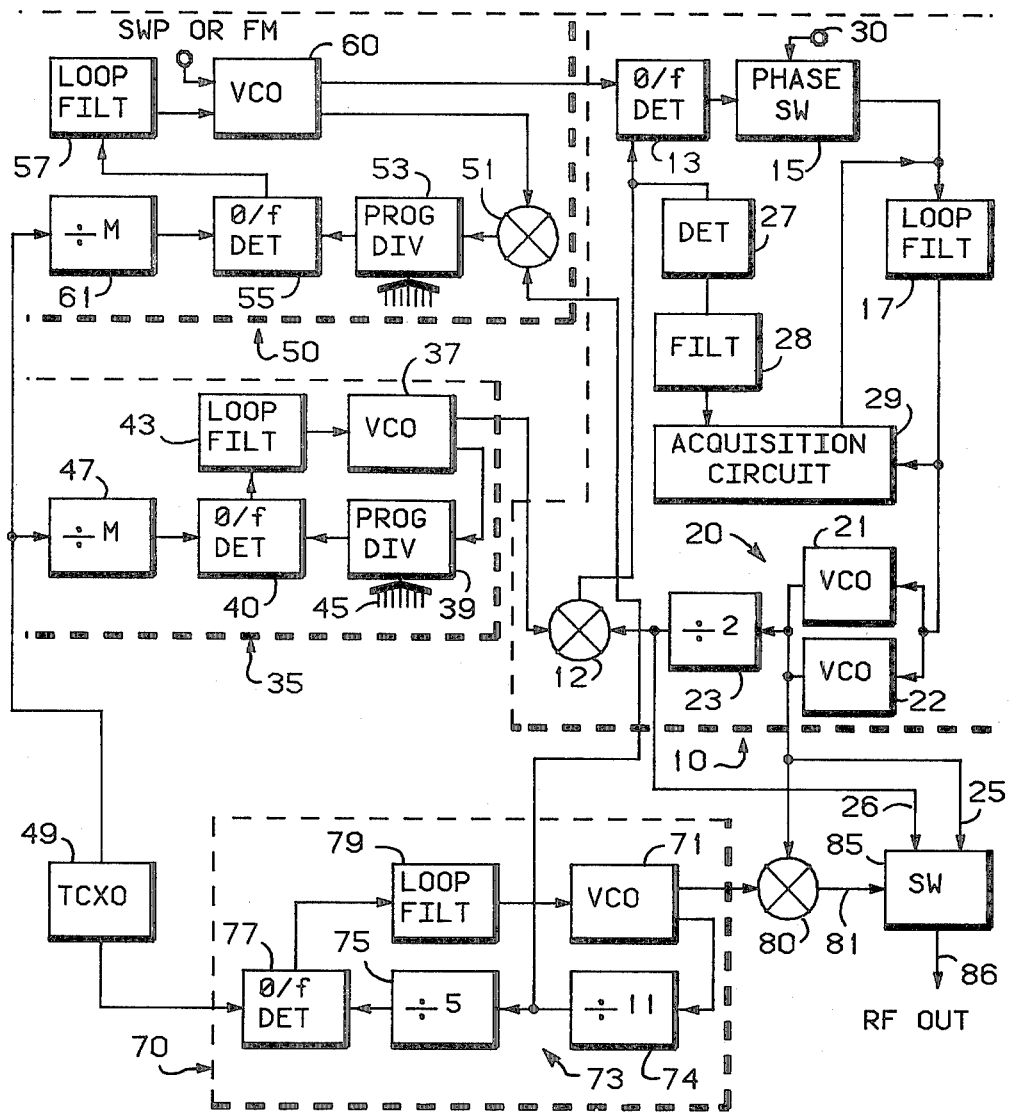
FIG. 2 is a block diagram of a frequency synthesizer embodying the present invention.

Referring specifically to FIG. 2, a first phase locked loop (PLL) generally designated 10 includes a mixer 12, a phase detector 13, a phase switch 15, a loop filter 17 and oscillator circuitry generally designated 20. The oscillator circuitry 20 includes a first oscillator 21 designed to operate in a range from approximately 500 megahertz to 700 megahertz, a second oscillator 22 designed to operate in a range approximately from 700 megahertz to 1 gigahertz and a divide-by-two divider 23. Outputs from either of the oscillators 21 and 22 are supplied through the divider 23 to one input of the mixer 12. Also, outputs of either of oscillators 21 and 22 are supplied to an output terminal 25 and the output of the divider 23 is supplied to an output terminal 26. Signals from the mixer 12 are supplied to the phase detector 13 and control signals from the phase detector 13 are supplied through the phase switch 15 and loop filter 17 to control inputs of each of the oscillators 21 and 22. A terminal 30 is connected to the phase switch 15 for activation thereof and is adapted to receive signals representative of invert and non-invert modes of operation.

A second phase locked loop, generally designated 35, includes an oscillator 37, a programmable divider 39, a phase detector 40 and a loop filter 43. The oscillator 37 is designed to operate in a range of approximately 310 megahertz to 440 megahertz. Outputs of the oscillator 37 are supplied to a second input of the mixer 12 and to the programmable divider 39. The programmable divider 39 has a plurality of inputs 45 designed to receive a digital signal thereon representative of a specific desired step frequency. Output signals from the divider 39 are applied to one input of the phase detector 40 a second input of which is connected through a divider 47 to an output of a temperature controlled crystal oscillator 49. The control signal output of the phase detector 40 is connected through the loop filter 43 to the control input of the oscillator 37.

A third phase locked loop, generally designated 50, includes a mixer 51, a programmable divider 53, a phase detector 55, a loop filter 57 and an oscillator 60. The oscillator 60 is designed to operate in a range of approximately 60.5 megahertz to 60.6 megahertz and supplies output signals to the mixer 51 and to the phase detector 13 of the first PLL 10. An output signal from the mixer 51 is supplied through the programmable divider 53 to one input of the phase detector 55. A second input of the phase detector 55 is supplied through a divider 61 from the crystal oscillator 49. The control signal from the phase detector 55 is supplied through the loop filter 57 to the oscillator 60.

A fourth phase locked loop, generally designated 70, includes an oscillator 71, dividing means generally designated 73 and including a first divider 74 and a second divider 75, a phase detector 77 and a loop filter 79. The oscillator 71 is designed to operate at 550 megahertz and supplies an output signal to the divider 74 and to a mixer 80. A second input of the mixer 80 is connected to the oscillator 21 and 22 of the first loop 10 and an output of the mixer 80 is connected to an output terminal 81. The frequency divided signal from the divider 74 is connected to the second divider 75 and to an input of the mixer 51 of the third loop 50. The output of the divider 75 is connected to one input of the phase detector 77 which receives a reference signal on a second input from the crystal oscillator 49. The control signal output is supplied through the loop filter 79 to a control input of the oscillator 71. The output terminals 25, 26 and 81 are applied to a selection circuit, or switch, 85 having a frequency synthesizer output at an output terminal 86.

While the four loops 10, 35, 50 and 70 are referred to herein as phase locked loops and the detectors 13, 40, 55 and 70 are referred to as phase detectors, it will be understood by those skilled in the art that the loops and detectors are phase and/or frequency loops and detectors. A typical commercially available phase detector which may be utilized for the phase detectors 13, 40, 55 and 77 is designated MC4344/4044 and is manufactured by Motorola Inc. The IC consists of two digital phase detectors, a charge pump, and an amplifier. Phase detector number one is intended for use in systems requiring zero frequency and phase difference at lock and phase detector number two is used if quadrature lock is desired or to indicate that the main loop, utilizing phase detector number one, is out of lock. Either phase detector accepts two inputs and generates an error voltage that is proportional to the frequency and/or phase differences of the input signals. It will of course be understood by those skilled in the art that many other types of phase detectors may be utilized.

Programmable dividers are well known in the art and are available commercially from a variety of sources. For example, a divide-by-n programmable divider can be constructed for operation to 200 megahertz utilizing an MC12012-modulus prescalar, an MC12014 counter control logic and one or more MC4016 programmable counters. As is well known in the art, the frequency of this programmable divider can be increased by using frequency extenders, etc. However, as the frequency range is increased upwardly the cost and complexity increases substantially. The upper operating frequency of the programmable divider 39 is reduced by one-half through the use of the divider 23 in the loop 10. The upper frequency and the range of the programmable divider 53 is reduced substantially by incorporating the mixer 51 in the loop 50 and introducing a 50 megahertz signal from the loop 70. While specific components for the programmable dividers have been mentioned herein, it will be understood by those skilled in the art that many other devices might be utilized. Further, the specific frequencies and divisions mentioned are simply used as examples and many other frequencies may be utilized by those skilled in the art.

In the operation of the embodiment illustrated in FIG. 2, the two oscillators 21 and 22 cooperate to provide a selected frequency within the range of 500 megahertz to 1 gigahertz and that frequency is available at the output terminal 25. The selected frequency is also divided by two in the divider 23 and applied to the mixer 12. The loop 35 supplies a reference frequency to the mixer 12 which is 60.5 megahertz above (high side mixing) or below (low side mixing) the frequency supplied to the mixer 12 from the divider 23. The phase switch 15 is utilized to select the high side or low side mixing desired.

Additional circuitry is required in conjunction with loop 10 to guarantee acquisition and lock on the selected frequency. During a change in frequency operation a mix is possible in mixer 12 which results in an output frequency that is too high. This causes an open loop 10 which may force loop 10 into a non-acquisition condition and prevent lock. To present this condition the output of mixer 12 is applied to a detector 27, the output of which is connected through a low pass filter 28 to an acquisition circuit 29. The acquisition circuit receives a second output from the loop filter 17 and supplies an output to the loop filter 17.

This additional circuitry in loop 10 detects and filters the output signals from mixer 12 to set an upper frequency limit of approximately 70 MHz. In this embodiment, as long as the mixer 12 output signal is below 70 MHz a control signal is applied to the acquisition circuit maintaining that circuit inactive. If the mixer 12 output signal exceeds 70 MHz the control signal is removed to allow the acquisition circuit 29 to go into operation. Briefly, the acquisition circuit 29 operates in conjunction with the loop filter 17 to produce sweep signals (generally a ramp or sawtooth wave) in a manner well known to those skilled in the art. The loop 10 continues in the sweep mode of operation until the proper phase detector 13 output is obtained, which will allow acquisition. It will of course be understood that other forms of insuring the correct acquisition may be devised by those skilled in the art and the present circuit is illustrated because of its simplicity and reliability.

A multi-bit, generally greater than 15, word applied to the input 45 of the divider 39 is utilized to select a specific frequency from the range of frequencies available in the oscillator 37. The oscillator 37 has a range from 310 megahertz to 440 megahertz and the divider 39 is programmable to select any desired frequency in the range in increments of 50 kilohertz steps. The output of the divider 39, which is supplied to the phase detector 40, is actually 50 kilohertz. The crystal oscillator 49 supplies a 10 megahertz signal which is divided by the divider 47 to supply 50 kilohertz to the phase detector 40 which is compared to the 50 kilohertz from the divider 39. The 50 kilohertz supplied through the divider 47 is very accurate and, therefore, holds the output frequency of loop 35 to a high degree of accuracy.

Thus, the oscillator 37 provides output signals incremented in 50 kilohertz steps which steps are supplied to the mixer 12 as a reference frequency signal. It should be noted that 50 kilohertz steps from the loop 35 will appear as 100 kilohertz steps at the output 26 of the divider 23. However, if 100 kilohertz steps are desired at the output 25, because of the divider 23, 100 kilohertz steps will be required at the output of the oscillator 37. Compensation for this difference in the size of the steps at the outputs 25 and 26 can be incorporated into the program at the input 45, if desired.

The 60.5 megahertz signal from the mixer 12 is applied to one input of the phase detector 13 and compared to the signal from the loop 50, which is applied to the other input of the phase detector 13. The oscillator 60 provides a signal at the phase detector 13 in the range of 60.5 to 60.6 megahertz and this signal is also applied to one input of the mixer 51. The loop 70 provides a fixed 550 megahertz signal at the output of the divider 74, which is mixed with the signal from the oscillator 60 in the mixer 51 to provide a 10.5 to 10.6 megahertz signal at the programmable divider 53. An 18 bit word is applied to the input of the programmable divider 53 for dividing the range into 50 Hertz increments and selecting any desired increment in response to the application of a predetermined digital signal. The output of the programmable divider 53 is compared to the output of the divider 61, which is a 50 Hertz signal, in the phase detector 55 and the error signal is applied through the loop filter 57 to the oscillator 60 to control the oscillator 60 to the desired output signal. Comparing this output signal to the output from the mixer 12 in the phase detector 13 produces an error signal which is supplied through the loop filter 17 to the oscillator circuitry 20 to control the oscillator circuitry 20 to the correct output frequency. Again, the digital word supplied to the programmable filter 53 may include a variety of different sized increments if desired since it would be well within the skill of anyone experienced in the field to select every second or twentieth steps, for example, to provide 100 Hertz or 1 kilohertz steps, respectively.

In some instances harmonics from the loop 50 will coincide with funadmentals of the loop 35, thereby causing a beat due to oscillator 37 being injection locked by harmonics from loop 50 which in turn causes close-in spurious or residual FM. The specific operating frequencies of the loops 35 and 50 at which these beats occur can be determined in advance and the unique construction of the present synthesizer allows for preventative programming. In the present embodiment the loop 50 is programmed so that the predetermined combinations of frequencies can not occur. Whenever the selected output frequency of the synthesizer is such that the operating frequencies of the loops 35 and 50 could cause the undesired beats, then both loops are programmed (through the preprogrammed digital words applied to programmable dividers 39 and 53) in a 50 KHz direction to eliminate the problem. Loop 50 has the programming capability of being programmed an additional 50 KHz beyond its normal 100 KHz when this condition occurs.

The output frequency at the terminal 25, which comes directly from the oscillator circuitry 20, varies in a range from 500 megahertz to approximately 1 gigahertz (999.9999 megahertz). The output frequency at the terminal 26 varies in a range from 250 megahertz to approximately 500 megahertz (499.9999 megahertz). The output frequency at the terminal 81 varies in a range from 10 kilohertz to approximately 250 megahertz (249.9999 megahertz). To obtain the frequencies at the termina 81 the programmable dividers 39 and 53 are programmed so that the oscillator circuitry 20 provides a signal to the mixer 80 in the range of 550.01 megahertz to 800 megehertz and the mixer 80 subtracts the 550 megahertz from the oscillator 71 therefrom to produce the desired output frequency. The switch 85 and the digital words applied to the programmable dividers 39 and 53 must be externally controlled to provide the desired frequency at the output terminal 86.

Figure 3:
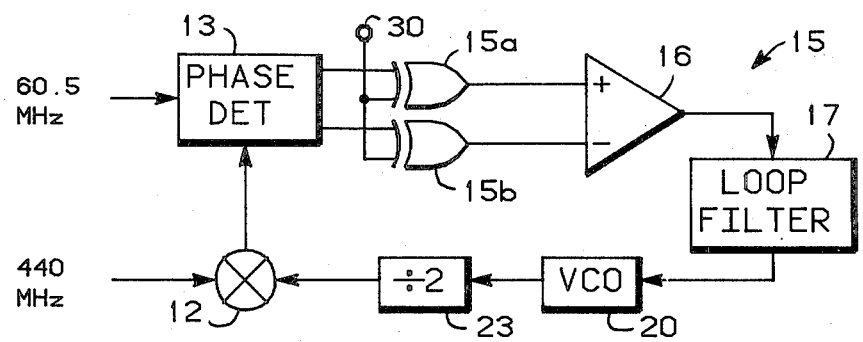
FIG. 3 is a more detailed block diagram of a portion of FIG. 2.

FIG. 3 illustrates a simplified block diagram of a phase switch 15 which will operate to provide the functions described. Phase detector 13 provides a pair of outputs, one of which normally indicates an up movement of the frequency is required and the other of which indicates that a down movement is required. One of the outputs is applied to a gate 15A and the other is applied to a gate 15B. The input terminal 30 is connected to a second input of each of the gates 15A and 15B. The outputs of the gates 15A and 15B are applied to the non-inverting (plus) and inverting (minus) inputs of an operational amplifier 16, respectively, the output of which is applied to the input of the loop filter 17.

In normal operation (if the switch 15 was not in the circuit) the outputs of the phase detector 13 would be applied to the operational amplifier 16 as a differential signal and the net result at the output of the amplifier 16 would control the oscillator circuitry 20 upward in frequency or downward in frequency, depending upon the phase/frequency comparison in the phase detector 13. The invert/non-invert signal at the terminal 30 is a high or low, respectively, signal which inverts the normal operation of the phase detector 13 and amplifier 16. In the present embodiment, when the oscillator circuitry 20 is operating below approximately 740 megahertz an invert or high signal is applied to the terminal 30 so that low side mixing occurs in the mixer 12. When the oscillator circuitry 20 is operating above approximately 740 megahertz a non-invert or low signal is applied to the terminal 30 to provide low side mixing in the mixer 12. Further, when high side mixing occurs in the mixer 12 the resultant frequency applied to the phase detector 13 will be below the reference frequency applied to the phase detector 13 from the oscillator 60. When low side mixing occurs in the mixer 12 the resultant frequency applied to the phase detector 13 is above the reference frequency applied to the phase detector 13 from the oscillator 60. Thus, the range of the oscillator 37 can be substantially reduced and the loop 35, including the programmable divider 39, can be greatly simplified.

The loop 50, in the present embodiment, is constructed with a narrow band, approximately 1 Hertz, and an external control input is provided for the oscillator 60. The external control input is adapted to receive sweep signals, for example sawtooth shaped voltage waveforms, or frequency modulation signals, sinusoidal shaped voltage waveforms. If the signals applied to the external control input of the oscillator 60 are relatively high frequency compared to the 1 Hertz bandwidth of the loop 50, the loop 50 will not be able to respond to these input signals and the oscillator 60 will be effectively modulated. Thus, the output of the synthesizer can be swept or frequency modulated by signals applied to the external input of the oscillator 60 without effecting the basic or center output frequency at which the synthesizer has been previously set.

Thus, an improved frequency synthesizer is disclosed which includes a first phase locked loop 10 which is a wide band loop for the best noise performance of the oscillator circuitry 20 and which includes loop inversion for high/low side mixing. The loop 10 increments or decrements the output frequency of the synthesizer according to the output frequencies of the second loop 35 and the third loop 50 and uses the output frequency of the loop 50 as a reference frequency for the phase detector 13. The second loop 35 has a loop bandwidth of approximately 100 Hertz which is considered the best noise/spurious signal tradeoff. The programmable loop 35 provides multiple frequency output with digital programming and the multiple frequency output has the high stability of the crystal oscillator 49. Further, the loop 35 acts as a low pass filter to the reference frequency and a high pass filter to any noise in the oscillator 37. The mixer 51 of the loop 50 provides a mix down feature which allows the programmable divider 53 to be much less complex and to be lower in power drain. The fourth loop 70 is a wide band loop which enables the voltage control oscillator 71 to be much less complex and, through the use of this fourth loop 70, the full range of output signals can be obtained with a single reference frequency oscillator 49. it will of course be understood that each of the oscillators 21, 22, 37, 60 and 71 may be, for example, voltage controlled oscillators or any other oscillator which is controllable over the ranges required by a control signal applied thereto.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. A frequency synthesizer controllable to produce any of a plurality of steps of frequency within a band of frequencies in response to control signals applied thereto, said synthesizer comprising:

(a) a first phase locked loop including frequency mixing means and phase detector means each having first and second inputs and an output and controllable oscillator means having an output and a control input, the output of said mixing means being coupled to the first input of said phase detector means, the output of said phase detector means being coupled to the control input of said oscillator means and the output of said oscillator means being coupled to the first input of said mixing means to complete said first loop, said controllable oscillator means including an acquisition circuit having control input means, a signal input and a signal output, a loop filter, and at least one oscillator, said loop filter being connected to pass control signals from said phase detector means to said at least one oscillator and said acquisition circuit having the signal input and output connected across said loop filter for producing sweep signals in response to said control input means, said control input means of said acquisition circuit being connected to the output of said mixing means for controlling said acquisition circuit to operate only when the frequency of the output of said mixing means exceeds a predetermined frequency;

(b) a second phase locked loop including a programmable divider programmable in predetermined division steps in response to a control signal applied thereto and a reference frequency source connected to an input of said second loop, said second loop providing a programmable reference frequency output coupled to the second input of said mixing means of said first loop; and (c) a third phase locked loop including a programmable divider programmable in predetermined division steps, different than the steps of said programmable divider of said second loop, in response to a control signal applied thereto and a reference frequency source coupled to an input of said third loop, said third loop providing a programmable reference frequency output coupled to the second input of said phase detector means of said first loop.

2. A frequency synthesizer as claimed in claim 1 wherein mixing means are included in the third phase locked loop and a fourth phase locked loop having a reference frequency source coupled thereto is coupled to an input of said mixing means of said third loop.

3. A frequency synthesizer as claimed in claim 2 wherein the controllable oscillator means of the first phase locked loop includes a pair of oscillators and a division circuit with a first output of the oscillator means being connected to the oscillators and a second output of the oscillator means being connected to the division circuit to provide a submultiple of the oscillators output.

4. A frequency synthesizer as claimed in claim 3 wherein the division circuit is a divide-by-two divider.

5. A frequency synthesizer as claimed in claim 3 including in addition mixing means having an output, a first input connected to receive an output from the fourth phase locked loop and a second input connected to the first output of the oscillator means and output selector means having an output, a first input connected to the first output of the oscillator means, a second input connected to the second output of the oscillator means and a third input connected to the output of said additional mixing means.

6. A frequency synthesizer controllable to produce any of a plurality of steps of frequency within a band of frequencies in response to control signals applied thereto, said synthesizer comprising:

(a) first, second, third and fourth phase locked loops each including oscillator means, phase detector means, and loop filtering means and said first and third loops including frequency mixing means;

(b) said second phase locked loop including a divider, programmable in predetermined division steps in response to a control signal applied thereto, connected to receive signals from the second loop oscillator means and supply frequency divided signals to the second loop phase detector means, the second loop phase detector means connected to receive a reference frequency from a reference frequency source and supply a control signal through the second loop filtering means to the second loop oscillator means, and the second loop oscillator means being connected to supply a reference signal to the first loop frequency mixing means;

(c) said third phase locked loop including a divider, programmable in predetermined division steps in response to a control signal applied thereto, connected to receive signals from the third loop frequency mixing means and supply frequency divided signals to the third loop phase detector means, the third loop phase detector means connected to receive a reference frequency from a reference frequency source and supply a control signal through the third loop filtering means to the third loop oscillator means and the third loop oscillator means connected to supply an output signal to the third loop mixing means and the first loop phase detector means;

(d) said first loop frequency mixing means being connected to receive an output signal from the first loop oscillator means and supply an output signal to the first loop phase detector means, the first loop phase detector means being connected to supply a control signal through the first loop filtering means to the first loop oscillator means;

(e) said fourth phase locked loop including fixed divider means being connected to receive an output signal from the fourth loop oscillator means, the fourth loop phase detector being connected to receive an output signal from the divider means and a reference frequency signal from a reference frequency source and supply a control signal through the fourth loop filtering means to the fourth loop oscillator means, the frequency divided signal from the divider means is also connected to the third loop mixing means; and (f) output means being connected to the first loop oscillator means and including mixing means supplying an output signal and connected to receive signals from the first loop oscillator means and the fourth loop oscillator means, said output means further including a switch having an output and inputs connected to the first loop oscillator means and to the mixing means of the output means to provide a wide band of output frequencies at the output of the switch.

7. A frequency synthesizer controllable to produce any of a plurality of steps of frequency within a band of frequencies in response to control signals applied thereto, said synthesizer comprising:

(a) a first phase locked loop having first and second reference frequency inputs and a selected frequency output;

(b) a second phase locked loop including a programmable divider programmable in predetermined division steps in response to a control signal applied thereto and a reference frequency source coupled to an input of said second loop, said second loop providing a programmable reference frequency output coupled to the first reference frequency input of said first loop;

(c) a third phase locked loop including a programmable divider programmable in predetermined division steps, different than the steps of said programmable divider of said second loop, in response to a control signal applied thereto and a reference frequency source coupled to an input of said third loop, said third loop providing a programmable reference frequency output coupled to the second input of said first loop, said third loop providing said programmable reference frequency output in one of a normal frequency range and an additional frequency range extending substantially beyond said normal range; and (d) said programmable divider of said second loop and said programmable divider of said third loop being preprogrammed to reject predetermined combinations of a second loop output frequency having a fundamental frequency and a third loop output frequency having a harmonic coinciding with said fundamental of said second loop output frequency, said programmable dividers being preprogrammed to replace each said rejected combination with a different combination, and said additional frequency range of said third loop providing an allowable combination corresponding to every rejected combination.

8. The frequency synthesizer according to claim 7 wherein said normal frequency range comprises approximately 60.5 megahertz to approximately 60.6 megahertz and said additional range extends approximately 60 kilohertz above and below said normal range.

9. A frequency synthesizer controllable to produce any of a plurality of steps of frequency within a band of frequencies in response to control signals applied thereto, said synthesizer comprising:

(a) a first phase locked loop including frequency mixing means and phase detector means each having first and second inputs and an output and controllable oscillator means having an output and a control input, the output of said mixing means being coupled to the first input of said phase detector means, the output of said phase detector means being coupled to the control input of said oscillator means and the output of said oscillator means being coupled to the first input of said mixing means to complete said first loop, said controllable oscillator means including an acquisition circuit having control input means, a signal input and a signal output, a loop filter, and at least one oscillator, said loop filter being connected to pass control signals from said phase detector means to said at least one oscillator and said acquisition circuit having the signal input and output connected across said loop filter for producing sweep signals in response to said control input means, said control input means of said acquisition circuit being connected to the output of said mixing means for controlling said acquisition circuit to operate only when the frequency of the output of said mixing means exceeds a predetermined frequency;

(b) a second phase locked loop including a programmable divider programmable in predetermined division steps in response to a control signal applied thereto and a reference frequency source connected to an input of said second loop, said second loop providing a programmable reference frequency output coupled to the second input of said mixing means of said first loop;

(c) a third phase locked loop including a programmable divider programmable in predetermined division steps, different than the steps of said programmable divider of said second loop, in response to a control signal applied thereto and a reference frequency source coupled to an input of said third loop, said third loop providing a programmable reference frequency output coupled to the second input of said phase detector means of said first loop; and (d) phase switching means coupled to said first phase locked loop for selecting one of the high side and low side mixing components.

10. A frequency synthesizer controllable to produce any of a plurality of steps of frequency withing a band of frequencies in response to control signals thereto, said synthesizer comprising:

a plurality of phase locked loops, connected to provide output frequencies in incremental steps, a first one of said loops including a programmable divider programmable in predetermined division steps in response to a control signal applied thereto, and a second one of said loops including a programmable divider programmable in predetermined division steps, different than the steps of said programmable divider of said first loop, in response to a control signal applied thereto, one of said first and second loops providing a programmable reference frequency output in one of a normal frequency range and an additional frequency range extending substantially beyond said normal range; and said programmable divider of said first loop and said programmable divider of said second loop being preprogrammed to reject predetermined combinations of a first loop output frequency having a fundamental frequency and a second loop output frequency having a harmonic coinciding with said fundamental of said first loop output frequency, said programmable dividers being preprogrammed to replace each said rejected combination with a different combination, and said additional frequency range of said second loop providing an allowable combination corresponding in output frequency to every rejected combination.

* * * * *